(12) United States Patent
Paik et al.

(10) Patent No.: US 7,381,468 B2
(45) Date of Patent: Jun. 3, 2008

(54) POLYMER/CERAMIC COMPOSITE PASTE FOR EMBEDDED CAPACITOR AND METHOD FOR FABRICATING CAPACITOR USING SAME

(75) Inventors: Kyung Wook Paik, Daejeon (KR); Kyung Woon Jang, Jeonrabuk-do (KR); Sung Dong Cho, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 369 days.

(21) Appl. No.: 10/920,456

(22) Filed: Aug. 18, 2004

(65) Prior Publication Data

US 2005/0080175 A1 Apr. 14, 2005

(30) Foreign Application Priority Data

Aug. 18, 2003 (KR) .................. 10-2003-0056851

(51) Int. Cl.
*B32B 27/38* (2006.01)
*C08L 63/00* (2006.01)

(52) U.S. Cl. .............. 428/413; 428/209; 361/305; 361/303; 361/312

(58) Field of Classification Search ........... 428/209, 428/413; 361/305, 303, 312
See application file for complete search history.

(56) References Cited

U.S. PATENT DOCUMENTS

| 3,975,492 | A | * | 8/1976 | McLean et al. ............. 264/263 |
| 6,001,283 | A | * | 12/1999 | Chang et al. ............. 252/519.4 |
| 6,128,177 | A | * | 10/2000 | Titulaer et al. ............. 361/305 |
| 6,470,545 | B1 | * | 10/2002 | Branchevsky ............. 29/25.42 |
| 6,475,555 | B2 | * | 11/2002 | Casey et al. ............. 427/98.5 |
| 6,562,179 | B1 | | 5/2003 | Ikeguchi et al. |
| 6,710,998 | B1 | * | 3/2004 | Saito et al. ............. 361/313 |
| 6,987,661 | B1 | * | 1/2006 | Huemoeller et al. ......... 361/312 |

(Continued)

FOREIGN PATENT DOCUMENTS

JP 08-183663 7/1996

(Continued)

OTHER PUBLICATIONS

English language abstract of JP 08-183663 (1996) Patent Abstracts of Japan (listed on accompanying PTO/SB/08A as document FP1).

(Continued)

*Primary Examiner*—Steven Loke
*Assistant Examiner*—David Goodwin
(74) *Attorney, Agent, or Firm*—Sterne, Kessler, Goldstein & Fox P.L.L.C.

(57) ABSTRACT

A polymer/ceramic composite paste for an embedded capacitor includes an organic solvent, a ceramic powder having a particle diameter of not more than 20 μm dispersed in the organic solvent, a polymer and a hardener. The use of the polymer/ceramic composite paste enables the formation of a dielectric layer having a high dielectric constant. The polymer/ceramic composite paste can be applied by a screen printing technique and is planarized to locally form a polymer/ceramic composite dielectric layer having a thickness of, e.g., up to 20 μm on a desired region. Accordingly, electrical parasitics resulting from the formation of a capacitor on unwanted regions can be reduced, and the capacitance error can be reduced.

13 Claims, 5 Drawing Sheets

U.S. PATENT DOCUMENTS

| | | | |
|---|---|---|---|
| 2003/0109378 A1* | 6/2003 | Kawakabe et al. | 502/150 |
| 2003/0113522 A1* | 6/2003 | Nishii | 428/209 |
| 2004/0108134 A1* | 6/2004 | Borland et al. | 174/260 |
| 2006/0159927 A1* | 7/2006 | Hara et al. | 428/413 |

FOREIGN PATENT DOCUMENTS

| | | |
|---|---|---|
| JP | 2000-203928 | 7/2000 |
| JP | 2001-233669 | 8/2001 |
| JP | 2001-347600 | 12/2001 |
| WO | WO 98/39784 | 9/1998 |

OTHER PUBLICATIONS

English-Language Abstract of JP 2000-203928 (2000) Patent Abstracts of Japan (listed on accompanying PTO/SB/08A as document FP2).

English-Language Abstract of JP 2001-233669 (2001) Patent Abstracts of Japan (listed on accompanying PTO/SB/08A as document FP3).

English-Language Abstract of JP 2001-347600 (2001) Patent Abstracts of Japan (listed on accompanying PTO/SB/08A as document FP4).

English-Language Abstract of JP 2002-265797 (2002) Patent Abstracts of Japan (listed on accompanying PTO/SB/08A as document FP5).

Cho, S.-D. et al., "Study on the Epoxy/BaTIO$_3$ Embedded Capacitor Films Newly Developed for PWB Applications," *52nd Electron. Comp. Technol. Conf. Proc. 28-31*:504-509 (2002) Institute of Electrical and Electronics Engineers, Inc.

* cited by examiner

POLYMER/CERAMIC COMPOSITE PASTE FOR EMBEDDED CAPACITOR AND METHOD FOR FABRICATING CAPACITOR USING SAME

CROSS-REFERENCE TO RELATED APPLICATIONS

This application claims priority to Korean Patent Application No. 10-2003-0056851, filed Aug. 18, 2003, which is incorporated herein by reference in its entirety.

BACKGROUND OF THE INVENTION

1. Field of the Invention

The present invention relates to a polymer/ceramic composite paste for an embedded capacitor, and a method for fabricating an embedded capacitor using the composite paste. More particularly, the present invention relates to a polymer/ceramic composite paste for an embedded capacitor that has a high dielectric constant, which can be used for screen printing, and to a method for fabricating an embedded capacitor by screen printing.

2. Description of the Related Art

In recent years, there has been a growing interest in passive devices with high electrical performance for use in the manufacture of lightweight and compact electronic equipment. This is due to the fact that the number of passive devices used in electronic equipment is much greater than the number of active devices. For example, a portable mobile communication device has at least twenty times as many passive devices as active devices. Since many passive devices are currently mounted as discrete components on a surface of a substrate, they occupy a large area on the substrate, which results in a deterioration of the electrical performance, and in reliability problems with the final product.

An embedded passive ("integral passive") device technique refers to removing discrete passive devices from the surface of the substrate, and then integrating the passive devices on one layer of a multilayer substrate. This integration makes it possible to decrease the area occupied by the passive devices, increase chip density, and shorten the interconnection length of the devices, thereby improving the electrical performance due to decreased parasitics.

Capacitors have been a focus of intense interest because they represent 40% (or more) of the passive devices. In particular, de-coupling capacitors and by-pass capacitors play a key role in electronics.

Since polymer/ceramic composites have superior processability inherent to polymers, and a high dielectric constant inherent to ceramics, they have drawn attention as prime candidate materials for embedded capacitors. The use of such materials enables formation of low-cost capacitors having a better performance at a temperature of up to 200° C. In particular, a number of studies on epoxy/ceramic composites are now being actively undertaken, regarding their compatibility with plastic printed circuit boards (PCBs) currently used in the industry.

Conventional embedded capacitors are fabricated by patterning an electrically conductive region for a bottom electrode on a substrate, forming a dielectric layer on the entire surface of the bottom electrode, and patterning an electrically conductive layer (for a top electrode) on the dielectric layer. However, this process has disadvantages, such as poor alignment between the top and bottom electrodes, and non-uniform thickness of the dielectric layer caused by the top and bottom electrodes. Further, if a high dielectric constant layer is formed on a region of the printed circuit board outside the region of a capacitor, capacitive parasitics adversely affect signal transmission.

SUMMARY OF THE INVENTION

The present invention provides a polymer/ceramic composite paste for an embedded capacitor that enables the formation of a dielectric layer to a uniform thickness on a desired region.

The present invention also provides a method for fabricating an embedded capacitor using the polymer/ceramic composite paste.

The polymer/ceramic composite paste for an embedded capacitor can include an organic solvent, a ceramic powder having a particle diameter of not larger than 20 µm dispersed in the organic solvent, a polymer, and a hardener.

The paste further can further include a dispersant, a defoaming agent, a coupling agent and/or an additional organic solvent for viscosity reduction.

The invention also provides a method for fabricating an embedded capacitor, including forming a first electrode on a substrate; applying a polymer/ceramic composite paste on the first electrode, wherein the composite paste comprises an organic solvent, a ceramic powder having a particle diameter of not more than 20 µm and dispersed in the organic solvent, a polymer, and a hardener; hardening the composite paste; and forming a second electrode on the composite paste.

Screen printing (e.g., using a silk screen) can be used. The applied composite paste can be planarized, for example, by applying heat and pressure to the composite paste. A metal screen can also be used for printing. The hardener can be a latent hardener, e.g., with DICY or polymeric capsule-coated imidazole. The hardener can be a non-latent hardener. The ceramic powder comprises any of $BaTiO_3$, PMN—PT, BST and PZT, and the ceramic powder has a particle diameter of about 10 nm-10 µm and a dielectric constant of at least about 4. The polymer can include epoxy, polyimide, benzocyclobutane (BCB), polyacrylate, polyethylene terephthalate (PET), and a thermoplastic resin.

The composite paste can further include an additive with a dispersant, a defoaming agent, a coupling agent and/or an organic solvent. The additive can be in a range of 0.01 wt %-50 wt %. The hardening can be performed by heating the composite paste to about 180-200° C. The hardening can be performed by applying a pressure of about 50-200 psi to the composite paste.

In another embodiment, the invention-provides an embedded capacitor manufactured using the method described above.

Additional features and advantages of the invention will be set forth in the description that follows, and in part will be apparent from the description, or can be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION OF THE INVENTION

The present invention will now be described in more detail with reference to the accompanying drawings that illustrate some embodiments of the invention.

The invention is generally directed to a ceramic paste for an embedded capacitor that includes an organic solvent, a ceramic powder having a particle diameter of not more than 20 μm dispersed in the organic solvent, a polymer and a hardener. The invention is also directed to an embedded capacitor including the ceramic paste as a dielectric material. The invention is also directed to a method of fabricating an embedded capacitor that includes the steps of forming a first electrode on a substrate; applying a polymer/ceramic composite paste on the first electrode, wherein the paste includes an organic solvent, a ceramic powder having a particle diameter of not more than 20 μm and dispersed in the organic solvent, a polymer, and a hardener; hardening the composite paste; and forming a second electrode on the composite paste.

Figure 1:
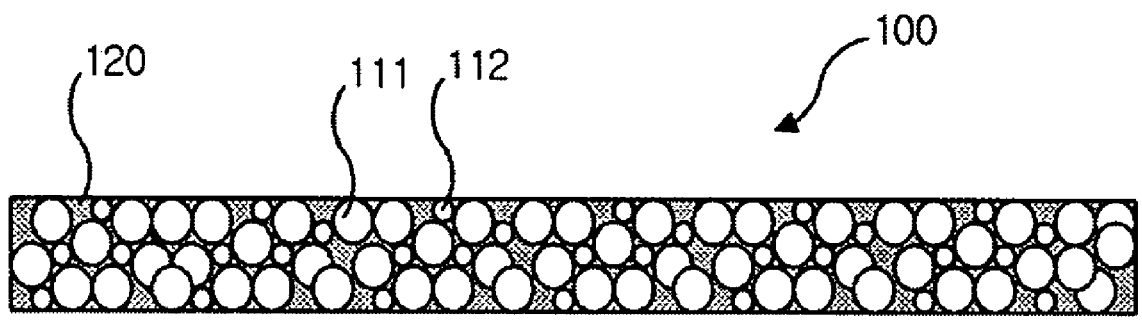
FIG. 1 is a cross-sectional view showing the structure of a polymer/ceramic composite paste for an embedded capacitor according to one embodiment of the present invention.

FIG. 1 illustrates an example of the invention, although it will be understood that the invention is not limited to the embodiment shown in this figure. Shown in FIG. 1 is a cross-sectional view showing a structure of a polymer/ceramic composite paste for an embedded capacitor, according to one embodiment of the present invention. FIGS. 2A to 2D are schematic representations of a method for fabricating an embedded capacitor using the polymer/ceramic composite paste of FIG. 1.

Referring to FIG. 1, the polymer/ceramic composite paste 100 for an embedded capacitor comprises primarily an organic solvent, ceramic powders 111 and 112, a polymer 120 and a hardener. As shown in FIG. 1, two kinds of ceramic powders having different particle diameters can be dispersed, although the invention can use a single ceramic powder, or three or more different ceramic powders (which may have different chemical composition and/or different particle diameter).

The ceramic powders 111 and 112 can be, for example, barium titanate ($BaTiO_3$), lead magnesium niobate-lead titanate (PMN-PT), barium strontium titanate (BST) or lead zirconium titanate (PZT), with a typical particle diameter of 10 nm-10 μm and a dielectric constant of not lower than about 4. As the content of the high dielectric constant ceramic powder increases, the dielectric constant of the final paste increases. Accordingly, as much of the ceramic powder as possible is preferably added, but the amount of the ceramic powder added is preferably not more than about 90% of the total weight of the paste, due to physical limitations on the addition.

The polymer can be, for example, thermosetting and thermoplastic resins. Considering thermal stability of resins, a thermosetting resin, such as epoxy, polyimide, benzocyclobutane (BCB), polyacrylate or polyethylene terephthalate (PET) is used as a base resin. A thermoplastic resin can be added.

A latent hardener, such as, e.g., dicyandiamide (DICY) or polymeric capsule-coated imidazole, can be used, so that no hardening reaction takes place at room temperature. Note that a general (non-latent) hardener can also be used, however, a hardening reaction occurs at room temperature, and thus the viscosity varies with passage of time, resulting in poor workability and poor storage stability.

For better rheological properties, e.g., viscosity and thixotropy of the paste, some or all of the following can be further added to the paste for viscosity reduction: a dispersant for improving the dispersion of the powder, a defoaming agent for removing air bubbles formed inside the paste, a coupling agent for improving the interfacial properties between the ceramic powder and the polymer, or an additional organic solvent. The total amount of the dispersant, defoaming agent, coupling agent and organic solvent varies depending on the desired rheological properties, e.g., in the range of 0.01 wt %-50 wt % based on the total weight of the paste.

A method for preparing the polymer/ceramic composite paste is explained below.

First, a ceramic powder (or a mixture of several ceramic powders 111, 112) and a dispersant are dispersed in an organic solvent to obtain a suspension. Optionally, additives, such as a coupling agent and a defoaming agent, are added to the suspension. At this time, the viscosity of the paste can be adjusted by appropriately controlling the amount of the organic solvent used. To help dispersion of the ceramic powder, various ultrasonic homogenizers, ball mills and mixers can be used.

Next, a polymer and a hardener are added to the suspension, and mixed using, e.g., a ball mill or a mixer, to prepare the final paste.

The use of the high dielectric constant polymer/ceramic composite paste enables an effective formation of a dielectric of an embedded capacitor. Accordingly, since such an embedded capacitor can replace conventional surface-mounted discrete capacitors, the size and weight of the overall package is reduced, and electrical performance is improved due to shortened interconnection length. Mechanical reliability is also improved due to fewer soldering connections.

Referring now to FIGS. 2A to 2D, a method for fabricating an embedded capacitor using the polymer/ceramic composite paste will be described below.

Figure 2A:
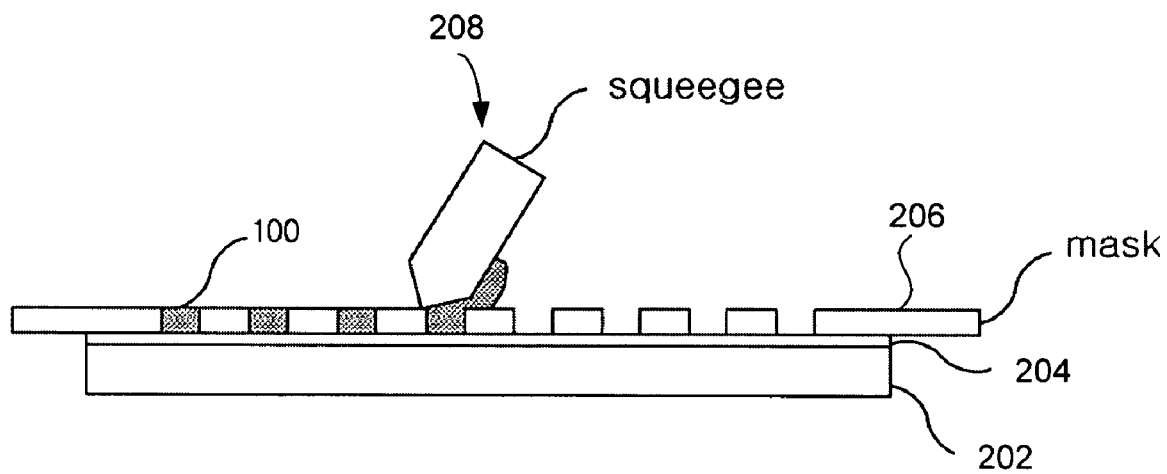
FIGS. 2A to 2D are schematic representations of a method for fabricating an embedded capacitor using the polymer/ceramic composite paste of FIG. 1.

First, a bottom electrode layer 204 is formed on substrate 202. Next, as shown in FIG. 2A, after a mask 206 on which a plurality of holes are patterned into the same shape as a dielectric layer is placed on the bottom electrode layer 204, the paste 100 is placed onto one upper side of the mask 206, and is then spread using a squeegee 208 by a screen printing technique, so that it is applied on the bottom electrode layer 204 through the holes of the mask 206. The removal of the mask 206 allows the paste 100 to have the same shape as the pattern of the mask 206. The mask 206 can be made, for example, of silk or metal. The paste 100 is consolidated to form a dielectric layer 210. The thickness of the dielectric layer 210 is determined by the solid content of the paste 100 and the thickness of the mask 206. For high capacitance, the thickness of the dielectric layer 210 should be as small as 20 μm. The thickness of the mask 206 is preferably in the range of 25-100 μm. In some embodiments, the polymer/ceramic composite paste 100 can be applied by a screen printing technique to locally form a polymer/ceramic composite dielectric layer 210 having a thickness of not more than 20 μm on the desired region. Accordingly, inductive and capacitive parasitic components resulting from the formation of a capacitor on unwanted regions can be reduced.

Figure 2B:
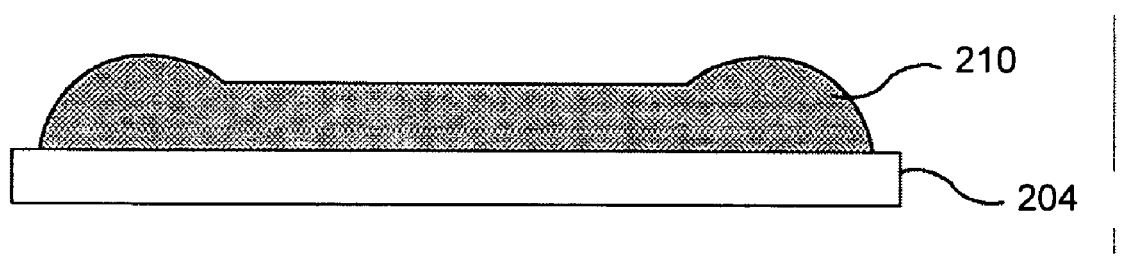
Figure 2C:
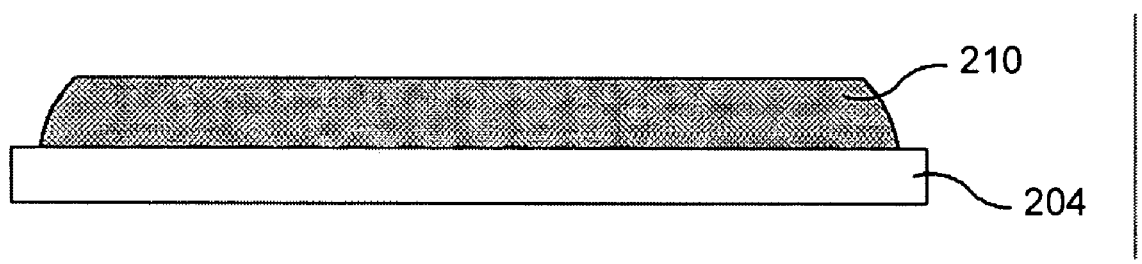

On the other hand, as shown in FIG. 2B, both edges of the dielectric layer 210 formed by a screen printing technique usually have a larger thickness than other portions. This problem becomes more serious if a silk mask is used. Desirable flowability and planarizability can be attained by appropriately controlling rheological properties of the paste 100. Alternatively, the applied paste 100 is planarized under heat and pressure. As an example, the paste 100 is heated to an appropriate temperature to evaporate the organic solvent contained therein. When the polymer 204 is hardened by heating it to a temperature of 180-200° C. under a pressure of 50-200 psi, the dielectric layer 210 is planarized, as shown in FIG. 2C.

Figure 2D:
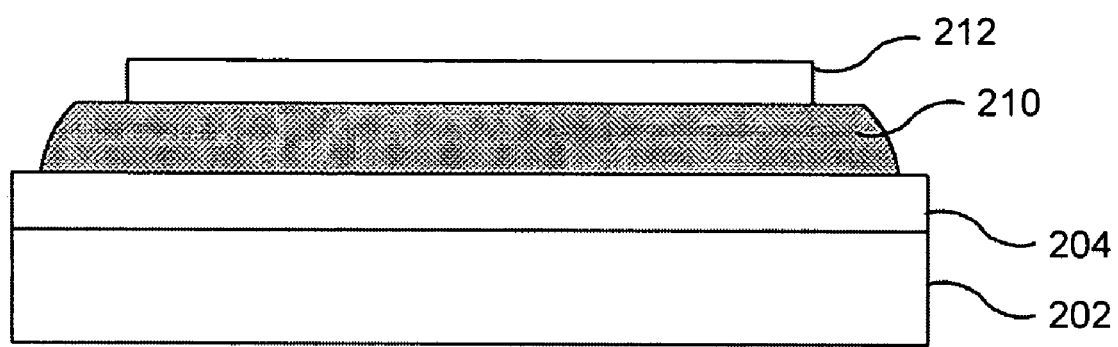

Thereafter, a top electrode layer 212 is formed on the dielectric layer 210 to fabricate a final capacitor shown in FIG. 2D.

As is apparent from the above description, the use of the polymer/ceramic composite paste according to the present invention enables the formation of a dielectric of a high dielectric constant embedded capacitor. Accordingly, since the embedded capacitor thus fabricated can replace conventional surface mounted discrete capacitors, the size and weight of an electronics package is reduced, the electrical performance is improved due to shortened interconnection length, and the mechanical reliability is improved due to fewer soldering connections.

In addition, using to the method for fabricating an embedded capacitor of the present invention, the polymer/ceramic composite paste can be applied by a screen printing technique to locally form a polymer/ceramic composite dielectric layer having a thickness of not more than 20 μm on the desired region. Accordingly, parasitics resulting from the formation of a capacitor on unwanted regions can be reduced. Furthermore, since the applied polymer/ceramic composite dielectric paste is pressurized while being hardened to form a planar dielectric layer, the capacitance error can be reduced.

CONCLUSION

While various embodiments of the present invention have been described above, it should be understood that they have been presented by way of examples only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined in accordance with the following claims and their equivalents.

What is claimed is:

1. A method for fabricating an embedded capacitor, the method comprising:
   forming a first electrode on a substrate;
   applying a polymer/ceramic composite paste on the first electrode, wherein the composite paste comprises an organic solvent, a ceramic powder having a particle diameter of not more than 20 μm and dispersed in the organic solvent, a polymer, and a hardener;
   hardening the composite paste, wherein the hardening comprises heating the composite paste to about 180-200° C. while applying a pressure of about 50-200 psi; and
   forming a second electrode on the composite paste.

2. The method of claim 1, wherein the applying utilizes screen printing.

3. The method of claim 2, wherein the applying utilizes a silk screen.

4. The method of claim 3, further comprising planarizing the applied composite paste.

5. The method of claim 4, wherein the planarizing is performed by applying heat and pressure to the composite paste.

6. The method of claim 2, wherein the applying utilizes a metal screen.

7. The method of claim 1, wherein the hardener is a latent hardener.

8. The method of claim 7, wherein the latent hardener comprises any of DICY and polymeric capsule-coated imidazole.

9. The method of claim 1, wherein the hardener is a non-latent hardener.

10. The method of claim 1, wherein the ceramic powder comprises any of $BaTiO_3$, PMN-PT, BST and PZT, and the ceramic powder has a particle diameter of about 10 nm-10 μm and a dielectric constant of at least about 4.

11. The method of claim 1, wherein the polymer comprises any of epoxy, polyimide, benzocyclobutane (BCB), polyacrylate, polyethylene terephthalate (PET), and a thermoplastic resin.

12. The method of claim 1, wherein the composite paste further comprises an additive that comprises any of a dispersant, a defoaming agent, and a coupling agent.

13. The method of claim 12, wherein the additive is in a range of 0.01 wt %-50 wt %.

* * * * *